United States Patent
Shchekin et al.

(10) Patent No.: US 9,046,634 B2
(45) Date of Patent: Jun. 2, 2015

(54) THIN FLASH OR VIDEO RECORDING LIGHT USING LOW PROFILE SIDE EMITTING LED

(75) Inventors: Oleg Borisovich Shchekin, San Francisco, CA (US); John Epler, Milpitas, CA (US); Gregory W. Eng, Fremont, CA (US); Serge Bierhuizen, Milpitas, CA (US); Gerard Harbers, Sunnyvale, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 1717 days.

(21) Appl. No.: 11/763,311

(22) Filed: Jun. 14, 2007

(65) Prior Publication Data
US 2008/0308824 A1 Dec. 18, 2008

(51) Int. Cl.
H01L 33/00 (2010.01)
F21V 8/00 (2006.01)
H01L 33/40 (2010.01)
H01L 33/46 (2010.01)

(52) U.S. Cl.
CPC ............ G02B 6/0073 (2013.01); H01L 33/405 (2013.01); H01L 33/46 (2013.01); H01L 2924/0002 (2013.01); H01L 2224/13 (2013.01)

(58) Field of Classification Search
CPC ..... G02B 6/0073; H01L 33/46; H01L 33/405
USPC ............ 257/98, 99, E33.061, E33.067, 257/E33.068, E33.071, E33.073, E33.074; 364/84, 606, 610, 612, 614, 615
See application file for complete search history.

(56) References Cited

U.S. PATENT DOCUMENTS

| | | | |
|---|---|---|---|
| 5,886,401 A * | 3/1999 | Liu | 257/678 |
| 5,955,748 A * | 9/1999 | Nakamura et al. | 257/88 |
| 6,627,922 B1 * | 9/2003 | Ishinaga | 257/99 |
| 6,828,596 B2 | 12/2004 | Steigerwald | |
| 6,876,008 B2 | 4/2005 | Bhat et al. | |
| 6,974,229 B2 * | 12/2005 | West et al. | 362/227 |
| 7,052,152 B2 * | 5/2006 | Harbers et al. | 362/30 |
| 7,188,988 B2 * | 3/2007 | Koganezawa | 362/616 |
| 7,452,737 B2 * | 11/2008 | Basin et al. | 438/27 |
| 7,534,025 B2 * | 5/2009 | Harbers et al. | 362/612 |
| 7,626,210 B2 | 12/2009 | Shchekin | |

(Continued)

FOREIGN PATENT DOCUMENTS

| | | |
|---|---|---|
| EP | 1376708 A2 | 1/2004 |
| EP | 1403934 A2 | 3/2005 |

(Continued)

OTHER PUBLICATIONS

Oleg Shchekin, "Low Profile Side Emitting LED," U.S. Appl. No. 11/423,419, filed Jun. 9, 2006, 21 pages.

(Continued)

*Primary Examiner* — Hrayr A Sayadian (57) ABSTRACT

Very thin flash modules for cameras are described that do not appear as a point source of light to the illuminated subject. Therefore, the flash is less objectionable to the subject. In one embodiment, the light emitting surface area is about 5 mm×10 mm. Low profile, side-emitting LEDs optically coupled to solid light guides enable the flash module to be thinner than 2 mm. The flash module may also be continuously energized for video recording. The module is particularly useful for cell phone cameras and other thin cameras.

17 Claims, 5 Drawing Sheets

(56) References Cited

U.S. PATENT DOCUMENTS

| | | | |
|---|---|---|---|
| 7,690,829 B2 * | 4/2010 | Sato et al. | 362/606 |
| 2002/0163790 A1 * | 11/2002 | Yamashita et al. | 362/31 |
| 2003/0218176 A1 * | 11/2003 | Zhao et al. | 257/81 |
| 2004/0028095 A1 * | 2/2004 | Ishida et al. | 372/36 |
| 2004/0065886 A1 * | 4/2004 | Eliashevich et al. | 257/79 |
| 2004/0070337 A1 * | 4/2004 | Goh et al. | 313/512 |
| 2004/0213315 A1 | 10/2004 | Kume et al. | |
| 2005/0073495 A1 * | 4/2005 | Harbers et al. | 345/102 |
| 2005/0205884 A1 * | 9/2005 | Kim et al. | 257/98 |
| 2006/0002146 A1 | 1/2006 | Baba | |
| 2006/0038196 A1 | 2/2006 | Chin et al. | |
| 2006/0050535 A1 * | 3/2006 | Chang | 362/621 |
| 2006/0105484 A1 * | 5/2006 | Basin et al. | 438/27 |
| 2006/0118775 A1 * | 6/2006 | Nagai et al. | 257/13 |
| 2006/0227546 A1 * | 10/2006 | Yeo et al. | 362/227 |
| 2006/0291244 A1 * | 12/2006 | Yang et al. | 362/609 |
| 2007/0086211 A1 * | 4/2007 | Beeson et al. | 362/628 |
| 2007/0138494 A1 * | 6/2007 | Pugh et al. | 257/98 |
| 2007/0147074 A1 * | 6/2007 | Sakai et al. | 362/608 |
| 2008/0049446 A1 * | 2/2008 | Harbers et al. | 362/612 |
| 2008/0137364 A1 * | 6/2008 | Liu | 362/606 |
| 2008/0149956 A1 * | 6/2008 | Mueller-Mach et al. | 257/98 |
| 2008/0170413 A1 * | 7/2008 | Beeson et al. | 362/612 |
| 2009/0045416 A1 * | 2/2009 | Bierhuizen et al. | 257/88 |
| 2009/0045420 A1 * | 2/2009 | Eng et al. | 257/98 |
| 2009/0046479 A1 * | 2/2009 | Bierhuizen et al. | 362/612 |

FOREIGN PATENT DOCUMENTS

| | | |
|---|---|---|
| EP | 1657758 A2 | 5/2006 |
| JP | 9036435 A | 2/1997 |
| JP | 2001-68784 | 3/2001 |
| JP | 2004-119984 | 4/2004 |
| JP | 2005093622 A | 4/2005 |
| JP | 2007005791 A | 1/2007 |
| JP | 2007033860 A | 2/2007 |
| JP | 2008216540 A | 9/2008 |
| JP | 2009033061 A | 2/2009 |

OTHER PUBLICATIONS

Gerard Harbers, "Thin Backlight with Flipped Light Emitting Diode," U.S. Appl. No. 11/467,522, filed Aug. 25, 2006, 18 pages.

* cited by examiner

THIN FLASH OR VIDEO RECORDING LIGHT USING LOW PROFILE SIDE EMITTING LED

FIELD OF INVENTION

This invention relates to solid state flashes for cameras or illumination lights for video cameras and, in particular, to very thin flashes and illumination lights for small cameras.

BACKGROUND

Flash modules in cellular telephones that incorporate a camera are now commonplace. Such flash modules must be thin since a desirable feature of cell phones is their small size. Many types of cell phone cameras also take digital movies, which may require the illuminator to be constantly on while the video is being recorded. The illuminator for flashes and video illumination will be referred to as a flash for simplicity. As used herein, the term camera refers to a still picture camera and/or a video recorder.

To improve reliability, reduce cost, and reduce size, it is known to replace the conventional, non-solid state flash bulbs with a high power light emitting diode (LED) that emits white light.

Bulbs (e.g., xenon) are relatively large and use a curved mirror to direct light toward the subject. This results in a relatively deep bulb module that is objectionable when extreme thinness is desirable. Such a module is also relatively expensive and requires a special high voltage generator, which is large. The arc produced in the bulb is an intense point of light that concentrates all the light output power in substantially a point source.

LEDs used as flashes are also typically mounted in a mirrored bowl. The LEDs output light in a Lambertian pattern, and the curved mirror redirects light toward the subject. Even though LED dice are very thin, the dice are typically mounted on a submount and packaged. The package contains a reflector and lens, and the overall package typically has a thickness on the order of 5 mm. The package is mounted on a printed circuit board, which adds more thickness to the module. The LED flash is substantially a point source, since the LED die is about 1×1 mm.

The intense point of light emitted by the bulb or LED is objectionable to the subject being photographed. If the light were diffused by a diffusing lens separated from the point light source, the thickness of the overall light module would greatly increase, and the extreme diffusing needed for a point source would inherently result in much of the point source light output being absorbed by the diffuser or reflected back toward the light source.

What is needed is an extremely thin illuminator for cameras, especially cell phone cameras, where the illuminator light output is spread over a relatively large area.

SUMMARY

Various side-emitting LED designs are described herein for creating a very thin flash for a camera. A small reflector above the LED die causes the light to be efficiently emitted within a relatively narrow angle generally parallel to the flash module's light output surface. No lenses are used to create the side emission. The LEDs have a low profile, allowing the entire flash module to be less than 1 mm.

One or more of the side emitting LEDs are positioned within a thin light guide with reflective walls, except for a top opening. The bottom of the light guide has features that reflect the light upward. The light emitted through the top opening of the light guide is sufficiently diffused such that the light source appears to the subject to be spread out over a relatively large surface area, such as 0.5-2 $cm^2$ or greater. Since the LED light emitted from a die is not directly seen by the subject, there is no intense point source of light seen by the subject.

For further diffusion, a thin diffuser layer may be positioned over the light guide. To increase the brightness in the direction of the subject, a brightness enhancement layer may be used.

In one embodiment, the LED die(s) used in the flash module emit blue light, and one or more types of phosphors are located over the LED to emit light with red, green, and/or yellow components so that the resulting combination of emissions results in white light of any desired color temperature.

BRIEF DESCRIPTION OF THE DRAWINGS

Elements that are similar or identical in the various figures are labeled with the same numeral.

DETAILED DESCRIPTION

Embodiments of the present invention include flash modules comprising low profile side-emitting LEDs in conjunction with thin light guide designs for providing a relatively large light emitting surface. The flash is less objectionable than a point source flash yet provides equivalent light output power, and the flash module is much thinner than prior art flash modules.

Figure 1:
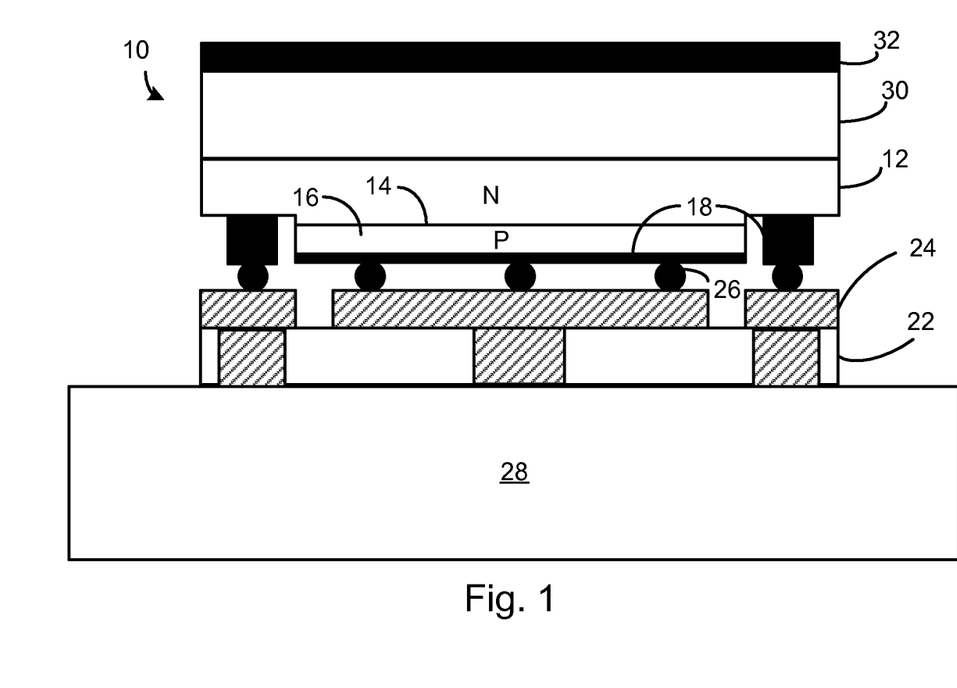
FIG. 1 is a cross-sectional view of a low profile, side-emitting LED used in a flash module in accordance with an embodiment of the invention.

FIG. 1 is a cross-sectional view of one embodiment of a thin, side-emitting LED 10. Other embodiments of thin, side-emitting LEDs that may be used in the flash module embodiments can be found in U.S. application Ser. No. 11/423,419, entitled Low Profile Side Emitting LED, filed Jun. 9, 2006, by Oleg Shchekin et al., assigned to the present assignee, and incorporated herein by reference.

The active layer of the LED 10 in one example generates blue light. LED 10 is formed on a starting growth substrate, such as sapphire, SiC, or GaN. Generally, an n-layer 12 is grown followed by an active layer 14, followed by a p-layer 16. The p-layer 16 is etched to expose a portion of the underlying n-layer 14. Reflective metal electrodes 18 (e.g., silver, aluminum, or an alloy) are then formed over the surface of the LED to contact the n and p layers. When the diode is forward biased, the active layer 14 emits light whose wavelength is determined by the composition of the active layer (e.g., AlInGaN). Forming such LEDs is well known and need not be described in further detail. Additional detail of forming LEDs is described in U.S. Pat. No. 6,828,596 to Steigerwald et al.

and U.S. Pat. No. 6,876,008 to Bhat et al., both assigned to the present assignee and incorporated herein by reference.

The semiconductor LED is then mounted on a submount 22 as a flip chip. A flip chip is a chip with all electrical terminals on the "bottom" surface of the chip for direct bonding to a submount or other mounting structure. The submount 22 contains metal electrodes 24 that are soldered or ultrasonically welded to the metal 18 on the LED via solder balls 26. Other types of bonding can also be used. The solder balls 26 may be deleted if the electrodes themselves can be ultrasonically welded together.

The submount electrodes 24 are electrically connected by vias to pads on the bottom of the submount so the submount can be surface mounted to metal pads on a printed circuit board (PCB) 28. Metal traces on the circuit board 28 electrically couple the pads to a power supply. The submount 22 may be formed of any suitable material, such as ceramic, silicon, aluminum, etc. If the submount material is conductive, an insulating layer is formed over the substrate material, and the metal electrode pattern is formed over the insulating layer. The submount 22 acts as a mechanical support, provides an electrical interface between the delicate n and p electrodes on the LED chip and a power supply, and provides heat sinking. Submounts are well known.

To cause the LED 10 to have a very low profile, and to prevent light from being absorbed by the growth substrate, the growth substrate is removed, such as by CMP or using a laser lift-off method, where a laser heats the interface of the GaN and growth substrate to create a high-pressure gas that pushes the substrate away from the GaN. In one embodiment, removal of the growth substrate is performed after an array of LEDs are mounted on a submount wafer and prior to the LEDs/submounts being singulated (e.g., by sawing).

After the growth substrate is removed, a planar phosphor layer 30 is positioned over the top of the LED for wavelength-converting the blue light emitted from the active layer 14. The phosphor layer 30 may be preformed as a ceramic sheet and affixed to the LED layers, or the phosphor particles may be thin-film deposited, such as by electrophoresis. The phosphor ceramic sheet may be sintered phosphor particles or phosphor particles in a transparent or translucent binder, which may be organic or inorganic. The light emitted by the phosphor layer 30, when mixed with blue light, creates white light or another desired color. The phosphor may be a YAG phosphor that produces yellow light (Y+B=white), or may be a red and green phosphor (R+G+B=white).

With a YAG phosphor (i.e., Ce:YAG), the color temperature of the white light depends largely on the Ce doping in the phosphor as well as the thickness of the phosphor layer 30.

A reflective film 32 is then formed over the phosphor layer 30. The reflective film 32 may be specular or diffusing. A specular reflector may be a distributed Bragg reflector (DBR) formed of organic or inorganic layers. The specular reflector may also be a layer of aluminum or other reflective metal, or a combination of DBR and metal. A diffusing reflector may be formed of a metal deposited on a roughed surface or a diffusing material such as a suitable white paint. The phosphor layer 30 also helps to diffuse the light to improve light extraction efficiency.

Although side-emitting lenses are sometimes used to divert all light emitted by an LED's top surface into a circular side-emission pattern, such lenses are many times the thickness of the LED itself and would not be suitable for an ultrathin flash.

Processing of the LED semiconductor layers may occur before or after the LED is mounted on the submount 22.

Virtually all light emitted by the active layer 14 is either directly emitted through the sides of the LED, or emitted through the sides after one or more internal reflections.

In one embodiment, the submount 22 has a thickness of about 380 microns, the semiconductor layers have a combined thickness of about 5 microns, the phosphor layer 30 has a thickness of about 200 microns, and the reflective film 32 has a thickness of about 150 microns, so that the LED plus the submount is less than 1 mm thick. Of course, the LED 10 can be made thicker. The length of each side of the LED is typically less than 1 mm.

If the LED need not be ultra-thin, the efficiency of the side emission may be increased by adding a clear wave guiding layer over the n-layer 12, a scattering layer over the phosphor layer incorporating reflective particles or a roughed/prism surface, and a dichroic mirror or a one-way mirror below the phosphor layer 30 so that light downwardly reflected by the reflective film 32 is not absorbed by the semiconductor layers.

Figure 2:
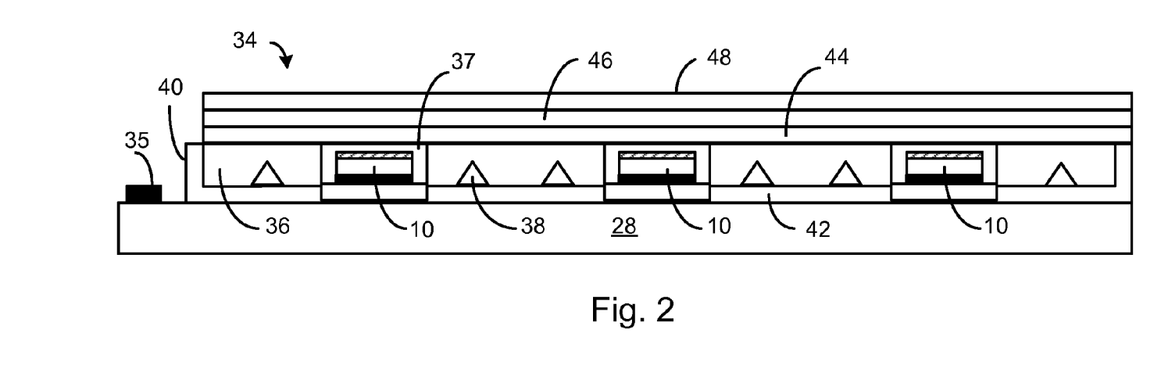
FIG. 2 is a cross-sectional view of a flash module cut through the LEDs in accordance with an embodiment of the invention.
Figure 3:
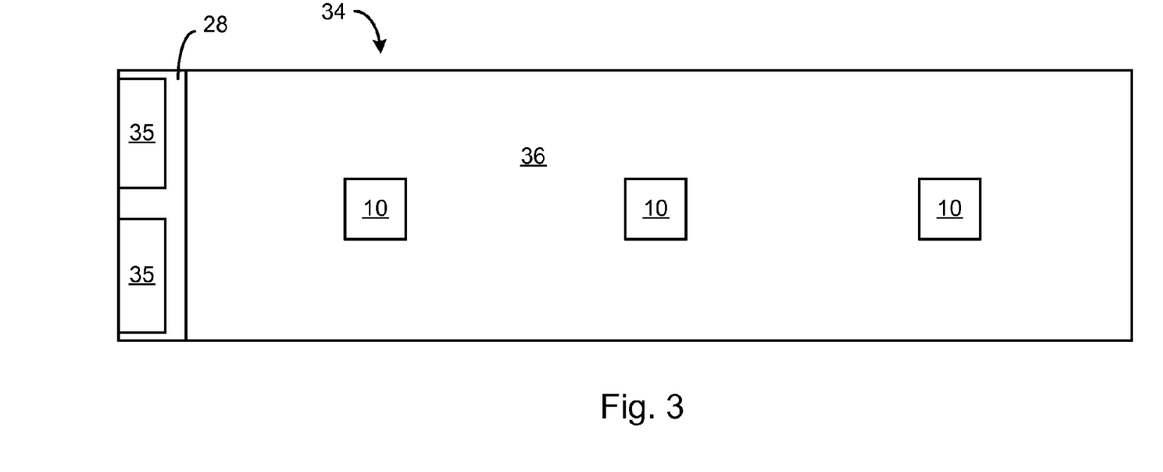
FIG. 3 is a top down view of the module of FIG. 2.

FIG. 2 is a cross-sectional view of a flash module 34 incorporating three LEDs 10, and FIG. 3 is a top down view of module 34 with the LEDs 10 exposed. In the top down view of FIG. 3, the LEDs 10 would typically not be well outlined if a diffuser sheet were used.

The LEDs 10 are mounted on a thin PCB 28. The PCB 28 may provide the base of the module 34, or there may be a separate support structure for the module 34, such as a reflective box. The submount electrodes 24 (FIG. 1) are ultrasonically bonded to conventional metal traces on the PCB 28 and terminate in connection pads 35 at the edge of the module 34. Any type of connector, such as pins, solder pads, plugs, etc., may be used, and the connectors may be at any location. The metal traces on the PCB 28 interconnect the LEDs 10 in any suitable manner such as serially and/or in parallel. A current source (not shown) is electrically coupled to the pads 35, and may be part of the module 34.

A solid transparent light guide 36 has cavities 37 in it through which the LEDs 10 are inserted. The light guide 36 may be a plastic (e.g., PMMA). Since the side-light emitting portion of the LEDs 10 can be about 0.25-0.5 mm thick, the thickness of the light guide 36 may be about 0.3-0.5 mm thick. Molded into the bottom of the light guide 36 are small indentations 38, such as prisms, that reflect the light upward. The indentations may be arranged periodically or distributed to maximize the uniformity of the light emitted through the top surface of the light guide 36. The indentations may instead be formed by etching or sand blasting to create a roughened bottom surface.

The light guide 36 has reflective walls 40 and a reflective bottom surface 42. A reflective film on the surface of the light guide 36 may be used as the reflectors, or the reflectors may be separate pieces that form a box in which the light guide 36 is positioned. The reflective film may be Enhanced Specular Reflector (ESR) film available from 3M Corporation. The side light generated by the LEDs 10 is reflected within the light guide 36 and leaked out by the indentations 38 to create a substantially uniform brightness pattern across the top surface of the light guide 36.

Over the top of the light guide 36 is placed an optional diffuser sheet 44, which helps fill in the small dark spots over the LEDs 10 with light and diffuses any bright spots over the indentations 38. The diffuser sheet 44 may be about 0.1 mm thick.

Brightness enhancement films (BEFs) 46 and 48 are positioned over the diffuser sheet 44 to redirect light generally normal to the surface. BEFs are well known for redirecting light through a selected angle. One type of BEF has prism surface features that refract light toward the subject. BEF 46 may limit the horizontal emission angle, while BEF 48 may limit the vertical emission angle. Each BEF 46 and 48 may be about 0.062 mm thick.

In one embodiment, the overall thickness of the module 34 is 0.62 mm. The typical total thickness may range between 0.3 mm and 2 mm. The light emitting surface area of the flash module 34 may be virtually any practical size such as 0.5-2 $^2$ cm or greater.

In another embodiment, the light guide is shaped as a wedge, where light is inherently reflected upward due to the angled bottom surface. No light scattering indentions are then required to redirect the light.

Figure 4:
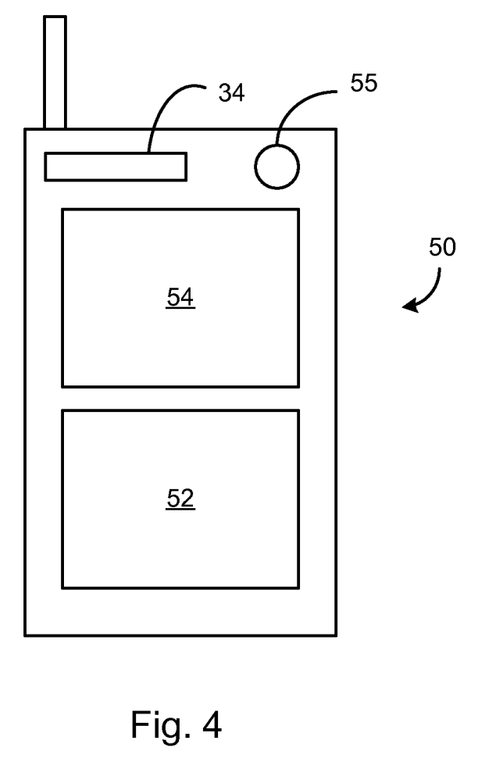
FIG. 4 illustrates a cell phone camera incorporating any of the flash modules described herein.

FIG. 4 is a simplified view of a cell phone camera 50, which may take video or still pictures. The camera 50 represents any type of camera (digital or film), whether it takes still pictures or video. The cell phone camera 50 has a conventional keypad 52, display 54, and camera lens 55. All aspects of the camera 50 may be conventional except for the flash module 34. The flash module 34 is preferably at least 5 mm wide to spread the brightness over an area much larger than a point source. In one embodiment, the module 34 light emitting surface is greater than 5×10 mm. In another embodiment, only one LED is used, and the module 34 is 5×5 mm. The thickness of the module 34 does not change with its light emitting surface area.

Figures 5, 6:
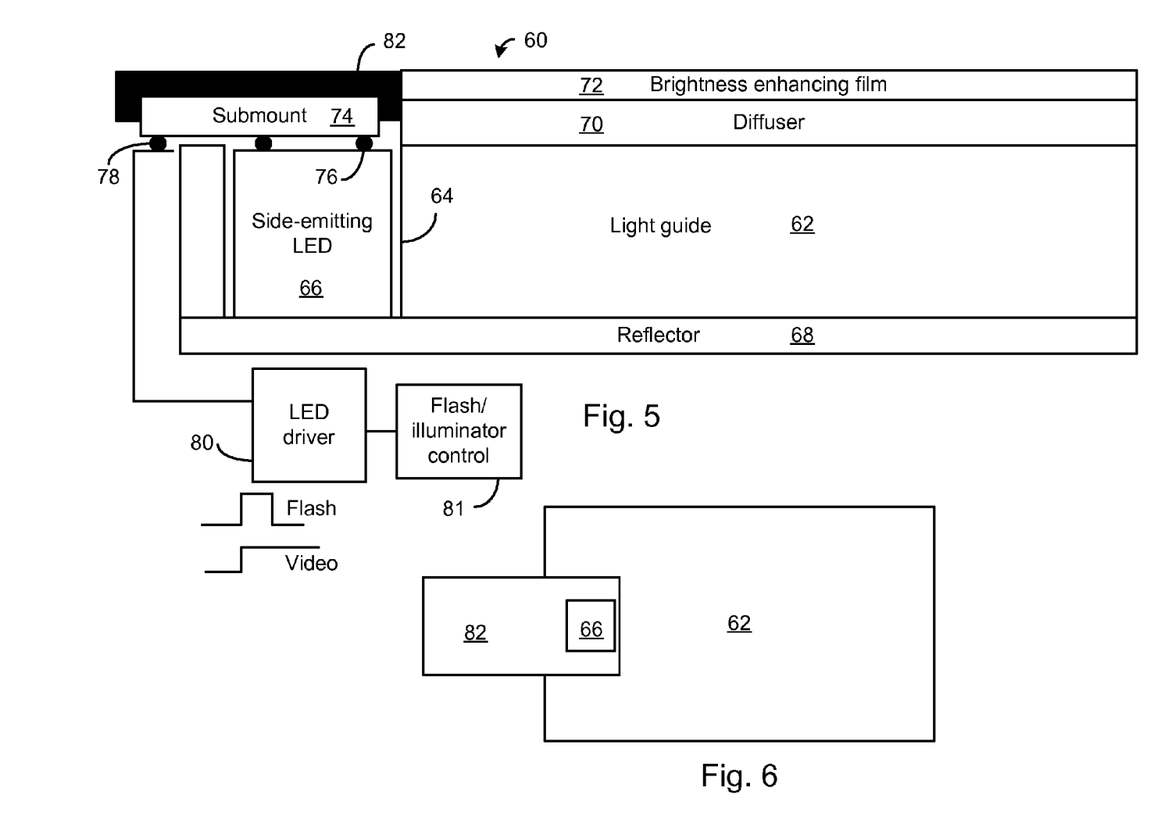
FIG. 5 is a cross-sectional view of a flash module where the LED is mounted upside down into a cavity in a light guide to reduce the thickness of the module.
FIG. 6 is a partially transparent top down view of the module of FIG. 5.

FIG. 5 is a cross-sectional of another embodiment of a flash module 60, and FIG. 6 is a see-through top down view of the module 60 of FIG. 5 showing the location of the LED die.

A solid transparent light guide 62, such as formed of a polymer or glass, has a cavity 64 formed in it, where the cavity has the approximate dimensions of a side-emitting LED 66 (similar to LED 10 in FIG. 1). Multiple LEDs may be inserted in additional cavities for increased light output. The side-emitting LED 66 emits most of its light at a low angle 360 degrees around the LED die. Thus, most of the light from the LED 66 is directly transmitted into the light guide 62. A reflector (not shown) may be located around the side walls of the light guide 62 to prevent light escaping from the side walls.

A bottom reflector 68 reflects light in the light guide 62 upward. The bottom reflector 68 extends below the LED 66 so that a separate reflector attached to the surface of the LED 66 is optional. The light guide 62 may have facets, a roughened surface, or other deformities to allow light to leak out the top surface of the light guide 62. The light guide 62 may even be wedge shaped. Many techniques are well known to uniformly leak light out of a light guide.

A diffuser sheet 70, which may be a translucent film, diffuses the light from the light guide 62 to increase the uniformity of light across the surface. At least one brightness enhancement film (BEF) 72 redirects light into a narrower angle to increase the brightness within that angle.

The LED 66 is mounted on a submount 74. The submount 74 may be formed of ceramic, silicon, an insulated metal plate, or other suitable material. Metal pads on the LED 66 are bonded to corresponding pads on the submount 74 (solder balls 76 are shown). The LED 66 is preferably a flip-chip to minimize thickness.

The submount 74 has terminals 78 that connect to an LED driver 80 that either provides a pulse of current to the LED 66 for a flash, to take a still picture, or provides a continuous current for taking a video. Conventional control circuitry 81 in the camera determines whether the operation is a flash or continuous illumination. For a flash, the LED driver 80 comprises a boost regulator that charges a capacitor then discharges the capacitor energy into the LED as a high power pulse. Preferably, the light output of the flash module is at least 10-15 lux.sec, where over 100 lux is emitted by the module for about 0.1 second. The total light energy while the camera shutter is open for a single picture is the relevant figure of merit for the flash. Flash LED drivers are commercially available, such as from Micrel, Inc., that can supply 1 amp to the LED.

A continuous light output for video requires a very robust power source since high power LEDs require over 0.5 amps to illuminate a subject for good video quality.

In addition to the submount 74 acting as an electrical interface between the driver 80 and the LED 66, the submount 74 also acts as a heat sink to remove heat from the LED 66. The surface of submount 74 may be reflective to reflect the LED light back towards the light guide 62.

The electrical connection between the submount 74 and the LED driver 80 can be easily realized by so called flex foil interconnects, as for example JTC Flex™, as manufactured by Gould Electronics. In case the submount is too small to attach to a flex foil, wirebonding might be used to make the electrical connections to the flex foil, clamped to the side of the submount, or the submount might be placed (glued) in a hole in the flex foil, or the LED 66 might be directly attached on top of a thin flex foil. The electrical connector, such as the flex foil, may additionally serve as a heat sink to remove heat from the LED die.

A metal support 82 is connected to both the light guide 62 and the submount 74 to affix the submount 74 in place and to act as an additional heat sink. The submount 74 may be adhesively affixed in place or secured by other suitable means, such as by a thermally conductive tape. In another embodiment, the submount 74 is directly affixed to the light guide 62 without any support member.

The metal support 82 may be a lead frame, where the metal support is split into at least two parts, each part being an electrical connection to provide the anode and cathode voltages to the LED die, as well as providing mechanical support and heat sinking. Either a submount with vias is used for direct bonding of the submount electrodes to the lead frame, or the submount is connected to the lead frame by means of wirebonds.

Since the LED 66 and submount 74 do not need any printed circuit board (PCB) for mechanical support, heat sinking, and electrical interfacing, the module 60 may be much thinner than the module 34 of FIG. 2.

Multiple LEDs with submounts may be used to couple additional light power into the light guide 62 along one or more sides of the light guide 62, or at the corners of the light guide 62, or through the center line of the light guide 62, or in any other configuration. The LEDs emit white light using a blue LED die and phosphors to contribute red, green, and/or yellow components.

The thicknesses of the various layers may be the same as described with respect to FIG. 2, where the resulting thickness of the entire module is less than 2 mm. The module 60 may be used in the camera 50 of FIG. 4 instead of the module 34. The surface area dimensions may be the same as described for the module 34. The driver 80 may be used with either module.

Figure 7:
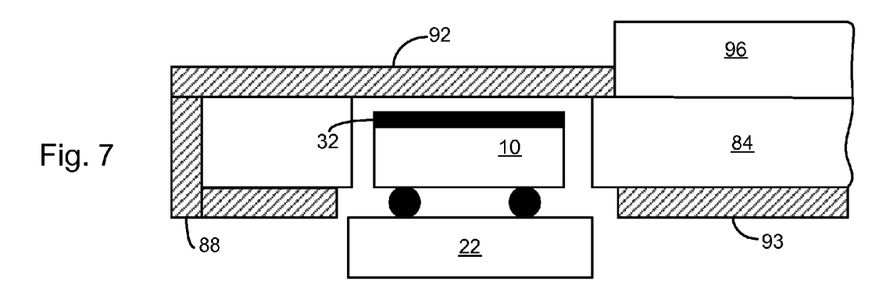
FIGS. 7, 8, and 9 are related partial cross-sectional views of additional embodiments of flash modules.
Figure 8:
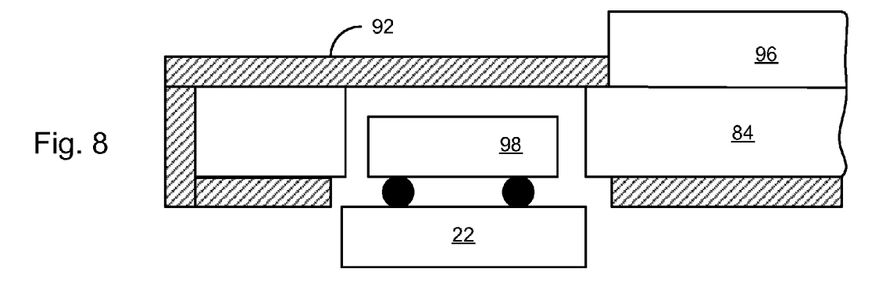
Figure 9:
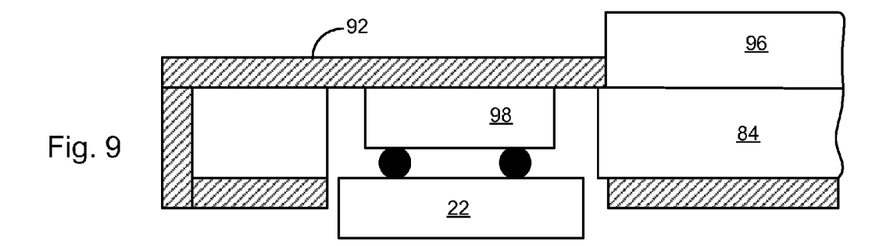

FIGS. 7-9 are close-up views of LEDs within a cavity of a light guide 84. The light guide 84 may be identical to the light guide 36 (FIG. 2) or 62 (FIG. 5). In FIGS. 7-9, light is more uniformly emitted by the light guide 84 since the LED is laterally spaced away from the light emitting surface portion of the light guide 84.

In FIG. 7, the LED 10 from FIG. 1 is used, having a reflective film 32 formed on its surface. The LED die is mounted on a submount 22. Reflective surfaces 88, 92, and 93 prevent light from escaping except through the top surface of the light guide 84. Layers 96 may be the same diffuser layer and BEF shown in FIGS. 2 and 5. There may be multiple side-emitting LEDs distributed throughout the light guide 84 for increased light output power. The resulting flash module may have the same thickness and surface dimensions as the module 34 of FIG. 2 for use in the camera 50 (FIG. 4).

FIG. 8 is similar to FIG. 7 except that the LED 98 does not have a reflective film formed on it. The reflector 92 serves the purpose of creating only side emission into the light guide 84 and preventing the photographed subject from seeing a point source of light.

FIG. 9 is similar to FIG. 8 except that the LED 98 abuts the reflector 92 to create a thinner flash module.

Features of the various embodiments may be combined as desired to produce a very thin camera illuminator with a relatively large light emitting surface area.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A device comprising:
   a side-emitting, none-lasing light emitting diode (LED) die, the LED die comprising:
      a first semiconductor layer of a first type;
      a second semiconductor layer of a second type;
      an active layer between the first semiconductor layer and second semiconductor layer, the active layer having a major surface;
      a first electrode in contact with the semiconductor layer;
      a second electrode in contact with the second semiconductor layer, the first electrode and the second electrode being on a first side of the LED die so that the LED die is a flip chip;
      a second side of the LED die, opposite the first side of the LED die, wherein a growth substrate has been removed from the second side;
      a uniform reflective film formed on the second side of the LED die without an air gap between the LED die and the reflective film, the reflective film forming a reflector substantially parallel to the major surface of the active layer, such that all light impinging on the reflector is redirected back into the LED die, the LED die only emitting light from its sides, wherein no lens is employed for causing the LED die to emit all of its light from its sides;
   a solid light guide having a top surface through which light is emitted, the light guide having a cavity, of approximate dimensions as the LED die, in which the side-emitting LED die is positioned, whereby light emitted from the sides of the LED die is optically coupled into the light guide;
   a reflector layer on a bottom surface of the light guide and covering the cavity;
   a reflector around side walls of the solid light guide;
   a submount supporting the LED die;
   a metal support structure, connected to the submount and the light guide, that acts as a heat sink for the LED die;
   a driver electrically connected to the first electrode and the second electrode of the LED die for supplying power to the led die to illuminate a subject for recording an image of the subject; and
   a camera, the LED die and driver being mounted within the camera,
   wherein the first side of the LED die faces the same direction as the top surface of the light guide, and wherein the submount and the metal support structure are located above the top surface of the light guide.

2. The device of claim 1 wherein the camera is a still picture camera, and the driver is configured for controlling the LED die to output a flash for taking a still picture of the subject.

3. The device of claim 1 wherein the camera is a video camera, and the driver is configured for controlling the LED to continuously output light for taking a video recording of the subject.

4. The device of claim 1 wherein the active layer and a bottom surface of the reflector are located between a top surface plane and a bottom surface plane of the light guide.

5. The device of claim 1 wherein the light guide has a thickness less than 2 mm.

6. The device of claim 1 wherein the LED die has a thickness less than 2 mm.

7. The device of claim 1 wherein the LED die further comprises a phosphor layer between the reflector and the second semiconductor layer.

8. The device of claim 7 wherein the LED die, including the phosphor layer, emits white light.

9. The device of claim 1 wherein light emitting sides of the LED die have a height less than 0.4 mm.

10. The device of claim 1 wherein the active layer emits blue light.

11. The device of claim 1 wherein the bottom surface of the light guide scatters light toward the top surface.

12. The device of claim 1 wherein the top surface of the light guide has a light emitting surface area greater than 25 square millimeters.

13. The device of claim 1 wherein the top surface of the light guide has a light emitting surface area greater than 50 square millimeters.

14. The device of claim 1 wherein the LED die is part of a flash module.

15. The device of claim 1 further comprising a plurality of side emitting in respective openings in the light guide.

16. The device of claim 1 wherein the camera is a cell phone camera.

17. The device of claim 1 further comprising a brightness enhancing layer over the light guide for directing the light emitted by the light guide toward the subject being illuminated.

* * * * *